(12) United States Patent
Kang et al.

(10) Patent No.: US 8,464,423 B2
(45) Date of Patent: Jun. 18, 2013

(54) METHOD OF MANUFACTURING A PRINTED CIRCUIT BOARD HAVING METAL BUMPS

(75) Inventors: Myung Sam Kang, Gyunggi-do (KR); Jeong Woo Park, Gyunggi-do (KR); Ok Tae Kim, Gyunggi-do (KR); Kil Yong Yun, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 4 days.

(21) Appl. No.: 13/373,387

(22) Filed: Nov. 14, 2011

(65) Prior Publication Data

US 2012/0060365 A1    Mar. 15, 2012

Related U.S. Application Data

(62) Division of application No. 12/379,684, filed on Feb. 26, 2009, now Pat. No. 8,141,241.

(30) Foreign Application Priority Data

Nov. 28, 2008  (KR) .................. 10-2008-0119895

(51) Int. Cl.
| | |
|---|---|
| H01R 9/00 | (2006.01) |
| H01R 43/16 | (2006.01) |
| H01R 43/00 | (2006.01) |
| H05K 3/00 | (2006.01) |
| H05K 3/02 | (2006.01) |
| H05K 3/10 | (2006.01) |

(52) U.S. Cl.
USPC .................. 29/842; 29/846; 29/874; 29/884; 174/261

(58) Field of Classification Search
USPC .................. 29/825, 830–834, 842, 846, 874, 29/884; 427/79, 80, 96; 174/255, 257, 260–262
See application file for complete search history.

(56) References Cited

U.S. PATENT DOCUMENTS

| | | | | |
|---|---|---|---|---|
| 4,564,323 | A | * | 1/1986 | Berbalk ........................ 409/200 |
| 4,597,177 | A | * | 7/1986 | Baldauf et al. .................. 29/878 |
| 4,712,161 | A | * | 12/1987 | Pryor et al. ..................... 361/779 |
| 5,260,518 | A | * | 11/1993 | Tanaka et al. .................. 174/261 |

(Continued)

FOREIGN PATENT DOCUMENTS

| | | |
|---|---|---|
| JP | 10-64954 | 3/1998 |
| JP | 2008-182163 | 8/2008 |
| JP | 2008-193065 | 8/2008 |

OTHER PUBLICATIONS

Japanese Office Action issued May 24, 2011 in corresponding Japanese Patent Application No. 2009-049589.

(Continued)

*Primary Examiner* — David Angwin

(57) ABSTRACT

A method of manufacturing a printed circuit board having a metal bump, including: forming a recess for creation of the metal bump on a first carrier, forming a first barrier layer on the first carrier, and forming an upper circuit layer on the first barrier layer, the upper circuit layer including a metal bump charged in the recess and a circuit pattern; forming a second barrier layer on a second carrier, and forming a lower circuit layer on the second barrier layer; preparing an insulating layer, and transferring the upper and lower circuit layers to the insulating layer; removing the first and second carriers; and removing the first and second barrier layers.

4 Claims, 8 Drawing Sheets

U.S. PATENT DOCUMENTS

| | | | | |
|---|---|---|---|---|
| 5,354,205 A | * | 10/1994 | Feigenbaum et al. | 439/67 |
| 5,412,539 A | * | 5/1995 | Elwell et al. | 361/792 |
| 5,453,404 A | * | 9/1995 | Leedy | 438/479 |
| 5,525,065 A | * | 6/1996 | Sobhani | 439/67 |
| 5,613,861 A | * | 3/1997 | Smith et al. | 439/81 |
| 5,629,835 A | * | 5/1997 | Mahulikar et al. | 361/719 |
| 5,855,063 A | * | 1/1999 | Schreiber et al. | 29/848 |
| 5,965,944 A | * | 10/1999 | Frankoski et al. | 257/779 |
| 6,351,885 B2 | * | 3/2002 | Suzuki et al. | 29/847 |
| 6,454,159 B1 | * | 9/2002 | Takushima | 228/253 |
| 6,710,258 B2 | * | 3/2004 | Oggioni et al. | 174/255 |
| 7,178,236 B2 | * | 2/2007 | Gleason et al. | 29/874 |
| 7,197,817 B2 | * | 4/2007 | Takahashi et al. | 29/830 |
| 7,323,779 B2 | * | 1/2008 | Ibaraki | 257/737 |
| 7,897,880 B1 | * | 3/2011 | Goergen et al. | 174/262 |
| 8,273,992 B2 | * | 9/2012 | Sato | 174/257 |
| 2002/0005292 A1 | * | 1/2002 | Kaneda et al. | 174/256 |
| 2004/0139603 A1 | * | 7/2004 | Takahashi et al. | 29/846 |
| 2004/0238210 A1 | * | 12/2004 | Droz | 174/258 |
| 2006/0016861 A1 | * | 1/2006 | Daubenspeck et al. | 228/180.21 |
| 2007/0062729 A1 | * | 3/2007 | Asai et al. | 174/262 |
| 2008/0003805 A1 | * | 1/2008 | Pang et al. | 438/613 |
| 2008/0190655 A1 | * | 8/2008 | Davoine et al. | 174/257 |

OTHER PUBLICATIONS

U.S. Patent Restriction Requirement mailed Apr. 21, 2011 in corresponding U.S. Appl. No. 12/379,684.

U.S. Patent Restriction Requirement mailed Jul. 13, 2011 in corresponding U.S. Appl. No. 12/379,684.

U.S. Patent Office Action mailed Sep. 7, 2011 in corresponding U.S. Appl. No. 12/379,684.

U.S. Appl. No. 12/379,684, filed Feb. 26, 2009, Myung Sam Kang et al., Samsung Electro-Mechanics Co., Ltd.

U.S. Appl. No. 13/373,388, filed Nov. 14, 2011, Myung Sam Kang et al., Samsung Electro-Mechanics Co., Ltd.

U.S. Patent Notice of Allowance mailed Jan. 3, 2012 in Parent U.S. Appl. No. 12/379,684.

U.S. Patent Office Action mailed Aug. 15, 2012 in corresponding U.S. Appl. No. 13/373,388.

Office Action for related U.S. Appl. No. 13/373,388 issued Jan. 29, 2013.

* cited by examiner

METHOD OF MANUFACTURING A PRINTED CIRCUIT BOARD HAVING METAL BUMPS

CROSS-REFERENCE TO RELATED APPLICATIONS

This application is a U.S. divisional application filed under 37 CFR 1.53(b) claiming priority benefit of U.S. Ser. No. 12/379,684 filed in the United States on Feb. 26, 2009, now U.S. Pat. No. 8,141,241 which claims earlier priority benefit to Korean Patent Application No. 10-2008-0119895 filed with the Korean Intellectual Property Office on Nov. 28, 2008, the disclosures of which are incorporated herein by reference.

BACKGROUND

1. Field

The present invention relates to a printed circuit board having metal bumps and a method of manufacturing the same, and more particularly to a printed circuit board having metal bumps which have even heights and make direct connections with a circuit pattern without using additional bump pads thus allowing the arrangement thereof at fine pitches, and a method of manufacturing the same.

2. Description of the Related Art

With the recent advancement of the electronics industry, electronic components are being developed to have high performance and thus there is a demand for miniaturized and highly-densified packages. Accordingly, interposers (substrates) which functions to connect ICs to a main board must be packed more densely. The high densification of packages is attributable to an increase of the number of I/Os of ICs, and the method for the connection with the interposers has also been made more efficient. As methods of mounting ICs on a board to manufacture a high density package, a wire bonding process or a flip bonding process are currently used. In this regard, as the number of I/Os is increased above a certain number, the flip chip process is preferably used because of an increase in the manufacturing costs.

FIGS. 1A to 1E are cross-sectional views showing a conventional process of manufacturing an outermost layer of a printed circuit board on which semiconductor chips are mounted.

As shown in FIG. 1A, a solder resist 15 is formed on a substrate 11 having pads 13. The solder resist 15 is positioned between the pads 13 so as to prevent solder paste 19 from flowing down and spreading out and over during the subsequent formation of bumps 23.

Thereafter, as shown in FIG. 1B, a print mask 17 is placed on the solder resist 15. At this point, the print mask 17 functions to block application of the solder paste onto the solder resist 15 and to enable the solder paste applied on the pads 13 to be of a predetermined height.

As shown in FIG. 1C, the pads 13 are printed with the solder paste 19 using a squeegee blade 21. Consequently, the solder paste 19 is charged in recesses defined by the solder resist 15 and the print mask 17.

As shown in FIG. 1D, the print mask 17 is removed from the solder resist 15. Subsequently, as shown in FIG. 1E, a reflow process is conducted, with the result that a printed circuit board having bumps 23 is manufactured.

However, the above-described conventional process of forming bumps of a printed circuit board using a printing technique is disadvantageous in that it is hard to realize bumps arranged at pitches of 120 μm or less. Accordingly, when bumps are formed at fine pitches using the printing technique, the bumps are abnormally shaped. Furthermore, even if the bumps are normally shaped, the volume of the bumps is excessively decreased.

In addition, since the pads 13 are formed using a plating technique, uneven thickness of the pads may occur because of inherent errors in the plating. Furthermore, since it is hard to evenly distribute the amount of solder paste used when printing it during the printing process, uneven heights of bumps 23 result so that bumps 23 which are not connected to a semiconductor chip may occur.

In addition, because the height difference between the solder resist and the pads 13 is considerably increased, there is a problem in that voids occur during an underfill process subsequent to the mounting of electronic components.

SUMMARY

Accordingly, the present invention has been made keeping in mind the above problems occurring in the prior art, and the present invention proposes a printed circuit board having metal bumps which are arranged at fine pitches and are of even heights, and a method of manufacturing the printed circuit board.

In an aspect, the present invention provides a method of manufacturing a printed circuit board having a metal bump, including: (A) forming a recess for creation of the metal bump on a metal carrier; (B) forming a barrier layer on the metal carrier including the recess; (C) forming an upper circuit layer on the barrier layer, the upper circuit layer including the metal bump charged in the recess and a circuit pattern; (D) preparing an insulating layer, and transferring the upper circuit layer to the insulating layer; and (E) removing the metal carrier and the barrier layer.

The method may further include, after (E) removing the metal carrier, forming a solder resist layer on the insulating layer, the solder resist layer having an opening through which the metal bump is exposed.

In the method, (A) forming the recess may include: (i) preparing the metal carrier; (ii) applying etching resist onto the metal carrier; (iii) subjecting the etching resist to a patterning process to form an opening for creation of the recess; (iv) etching a portion of the metal carrier which is exposed through the opening for creation of the recess; and (v) removing the etching resist.

The method may further include, after (B) forming the barrier layer, forming a seed layer on the barrier layer.

In the method, (C) forming the upper circuit layer may include: (i) applying plating resist on the barrier layer; (ii) subjecting the plating resist to a patterning process to form openings for creation of the circuit pattern, one of the openings exposing at least a portion of the recess therethrough; and (iii) plating the openings to form the upper circuit layer including the metal bump charged in the recess and the circuit pattern.

The metal carrier and the circuit layer may be made of electroconductive metal, and the barrier layer may be made of a metal that is selectively etchable with respect to the metal from which the metal carrier and the circuit layer are made.

The metal carrier may be made of copper, the upper circuit layer may be made of copper (Cu), tin (Sn), or alloy of tin (Sn) and silver (Ag), and the barrier layer may be made of nickel.

In another aspect, the present invention provides a method of manufacturing a printed circuit board having a metal bump, including: (A) forming a recess for creation of the metal bump on a first carrier, forming a first barrier layer on the first carrier, and forming an upper circuit layer on the first barrier layer, the upper circuit layer including a metal bump charged in the recess and a circuit pattern; (B) forming a second barrier layer on a second carrier, and forming a lower circuit layer on the second barrier layer; (C) preparing an insulating layer, and transferring the upper and lower circuit layers to the insulating layer; (D) removing the first and second carriers; and (E) removing the first and second barrier layers.

The method may further include, after (E) removing the first and second barrier layers, forming solder resist layers on both sides of the insulating layer.

The first and second carriers and the upper and lower circuit layers may be made of electroconductive metal, and the first and second barrier layers may be made of a metal that is selectively etched with respect to metals from which the first and second carriers and the upper and lower circuit layers are made.

The method may further include, after (D) removing the first and second carriers, forming a via for electrical connection between the upper and lower circuit layers.

In a further aspect, the present invention provides a printed circuit board having a metal bump, including: an upper circuit layer including a circuit pattern embedded in an upper part of an insulating layer, the circuit pattern being made of electroconductive metal; wherein the metal bump is integrally formed with the circuit pattern and protruding from the circuit pattern and above the insulating layer.

A portion of a lower surface of the metal bump may be connected to the circuit pattern.

The printed circuit board may further include a solder resist layer disposed on the insulating layer and having an opening through which the metal bump is exposed.

The printed circuit board may further include a lower circuit layer embedded in a lower part of the insulating layer.

The printed circuit board may further include a surface protection layer disposed on the metal bump, the surface protection layer being composed of an OSP surface-treated layer or a nickel and gold plating layer.

The circuit pattern and the metal bump may be made of copper (Cu), tin (Sn), or an alloy of tin (Sn) and silver (Ag).

The printed circuit board may further include a via for an electrical connection between the circuit pattern and the lower circuit layer.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF EMBODIMENTS

Figure 1A:
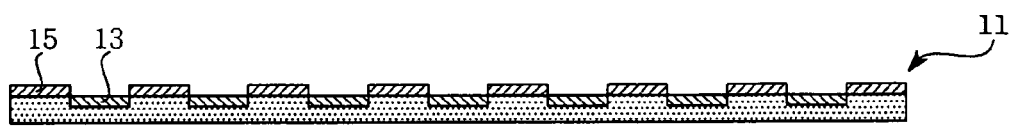
FIGS. 1A to 1E are cross-sectional views showing a conventional process of manufacturing an outermost layer of a printed circuit board on which semiconductor chips are mounted.
Figure 1B:
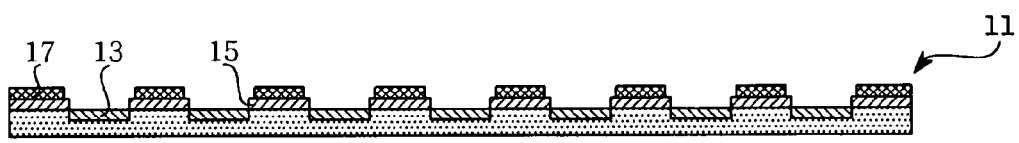
Figure 1C:
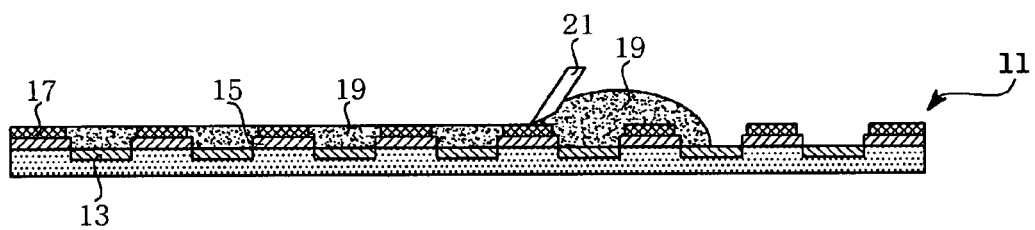
Figure 1D:
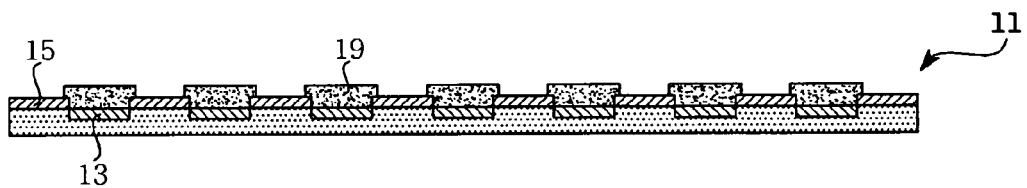
Figure 1E:
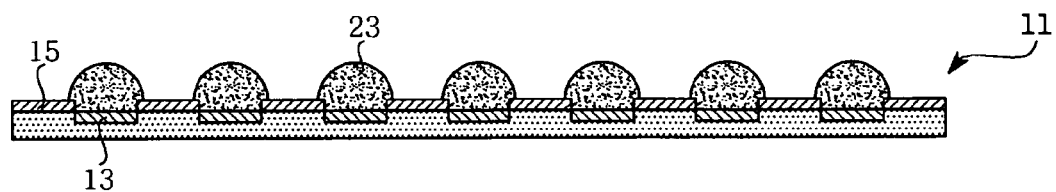

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Hereinafter, a printed circuit board having round solder bumps according to the present invention will be described in greater detail with reference to the accompanying drawings. Throughout the accompanying drawings, the same reference numerals are used to designate the same or similar components, and redundant descriptions thereof are omitted. In the following description, the terms "upper", "lower" and the like are used to differentiate a certain component from other components, but the configuration of such components should not be construed to be limited by the terms.

Figure 2A:
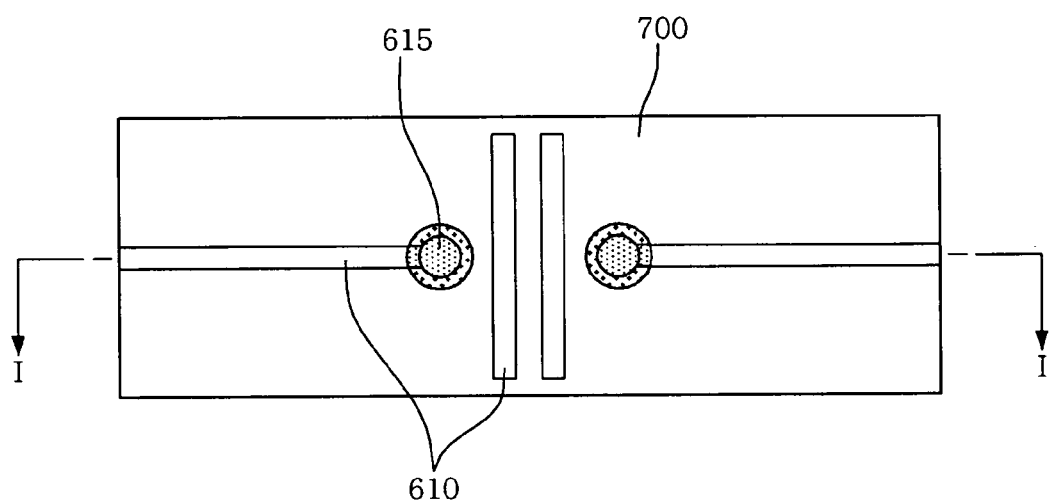
FIG. 2A is a plan view of a printed circuit board having metal bumps, according to an embodiment of the present invention.
Figure 2B:
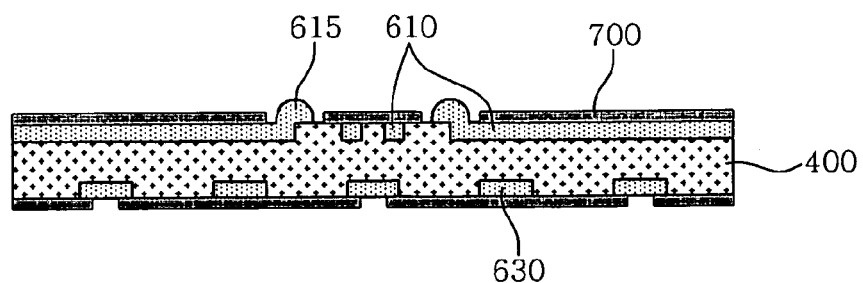
FIG. 2B is a cross-sectional view taken along line I-I of the printed circuit board having metal bumps shown in FIG. 2A.

FIG. 2A is a plan view of a printed circuit board having metal bumps, according to an embodiment of the present invention, and FIG. 2B is a cross-sectional view taken along line I-I of the printed circuit board having metal bumps shown in FIG. 2A.

As shown in the drawings, the printed circuit board having metal bumps according to this embodiment of the present invention comprises an upper circuit layer including a circuit pattern 610 made of electroconductive metal and embedded in an upper part of an insulating layer 400, and metal bumps 615 integrated with the circuit pattern 610.

The insulating layer 400 is made of complex polymer resin that is an electrical insulating material, for example, a prepreg, or a typical substrate material such as FR-4, BT (Bismaleimide Triazine), ABF (Ajinomoto Build up Film) and the like, but is not particularly limited thereto.

The circuit pattern 610, which is an electroconductive pattern suitable for transmission of electric signals, may be composed of a metal such as gold, silver, copper, nickel, tin, or an alloy of tin and silver. The circuit pattern 610 according to this embodiment is embedded in the insulating layer 400 but includes a surface exposed to the outside. The exposed surface refers to a surface of the circuit pattern 610 which is not embedded in the insulating layer 400 but does not refer to a surface which is exposed through another insulating layer that may be formed outside the insulating layer 400 or through the solder resist layer 700.

The metal bumps 615 are integrally formed with the circuit pattern 610 and protrude upwards from the circuit pattern 610 and thus from the insulating layer 400. The metal bumps 615 according to this embodiment are integrally formed with the circuit pattern 610 embedded in an upper part of the insulating layer 400, and are made of the same material as the circuit pattern 610. Therefore, although the metal bumps 615 are not clearly distinguished from the circuit pattern 610, the portions of the circuit pattern 610 which protrude higher than the other portion of the circuit pattern 610 can be denominated as the metal bumps 615. The metal bumps 615 play a role in forming the electrical connection with wiring of the printed circuit board and electrical components which are to be mounted on the printed circuit board later.

In this regard, although the metal bumps 615 may be configured such that each of them is connected at the entire lower surface with the circuit pattern 610, only a portion of the lower surface of a metal bump 615 is connected with the circuit pattern 610 in this embodiment. In this embodiment, the circuit pattern 610 and the metal bumps 615 are made of copper.

Figure 3:
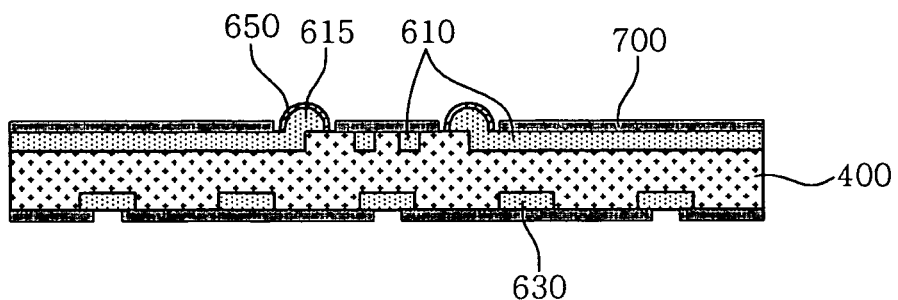
FIG. 3 is a cross-sectional view of the printed circuit board shown in FIG. 2A on which a surface protection layer is further formed.

As shown in FIG. 3, the metal bumps 615 may further include, for example, surface protection layers 650 composed of an OSP surface-treated layer or a nickel and gold plating layer. The surface protection layers 650 play a role in the prevention of damage to the metal bumps 615 and in allowing easy connection of electronic components which are mounted thereon later.

The printed circuit board according to the embodiment further includes a lower circuit layer 630 embedded in a lower part of the insulating layer 400. Although this embodiment is illustratively shown and explained for the clear expression of the construction as including the lower circuit layer 630 composed of a single circuit layer, it will be easily understood by those skilled in the art that the lower circuit layer 630, which is electrically connected to the upper circuit layer, may be composed of a plurality of circuit layers disposed one on another and insulating materials disposed between the plurality of circuit layers.

In addition, the printed circuit board according to this embodiment may further include solder resist layers 700 which are formed on both sides of the insulating layer 400, respectively, and which have openings through which the metal bumps 615 and connecting pads formed on the lower circuit layer 630 are exposed. The solder resist layers 700 function to protect the circuit layers exposed from the insulating layer 400.

Although not shown, the printed circuit board according to this embodiment may further include vias for electrically connecting the upper circuit layer including the circuit pattern 610 to the lower circuit layer 630.

The printed circuit board, which is configured in the above-described manner, includes the metal bumps 615 having no bump pad. Consequently, transmitting efficiency of electrical signals is improved, and a highly-densified outermost circuit layer in which bumps are arranged at fine pitches and are configured to be of even heights is realized.

Furthermore, since a height difference between the solder resist layer 700 and the insulating layer 400 is decreased, it is advantageous in terms of a reduction of voids occurring in underfill material during the mounting of electrical components.

FIGS. 4 to 19 are cross-sectional views sequentially showing a process of manufacturing a printed circuit board having metal bumps, according to an embodiment of the present invention.

First, a step of forming recesses 115 on a first carrier 110 for creating metal bumps 615 is conducted.

Figure 4:
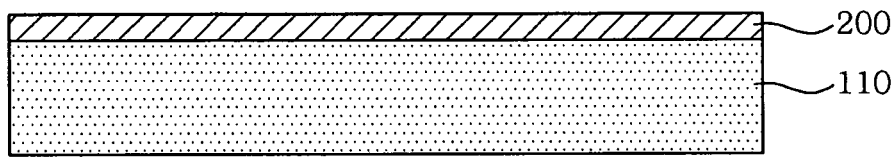
FIGS. 4 to 19 are cross-sectional views sequentially showing a process of manufacturing a printed circuit board having metal bumps, according to an embodiment of the present invention.

As shown in FIG. 4, the first carrier 110 is prepared, and etching resist 200 is applied onto the first carrier 110. Although the first carrier 110 may be made of a metal such as gold, silver, copper, nickel or the like, it is made of copper in this embodiment. After preparation of the first carrier 110, the etching resist 200, which is composed of a photosensitive dry film, is applied onto the first carrier 110.

Figure 5:
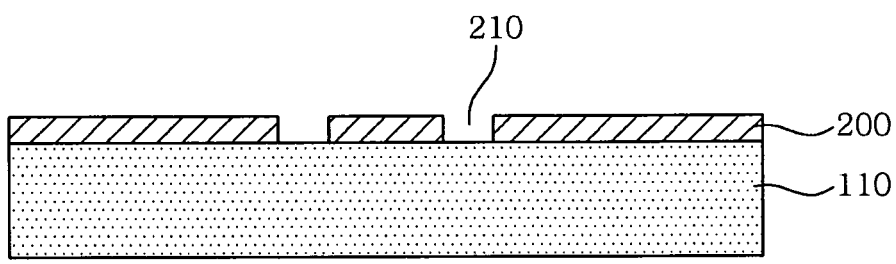

Thereafter, as shown in FIG. 5, the etching resist 200 is subjected to a patterning process to form openings 210 for the creation of recesses. More specifically, the openings 210 are formed in the etching resist 200 in a manner such that the etching resist 200 is selectively cured through a mask (not shown) having a light blocking pattern after which the uncured portion of the etching resist 200 is removed.

Figure 6:
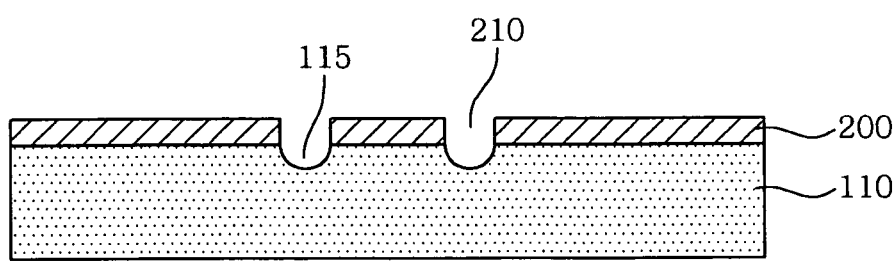
Figure 7:
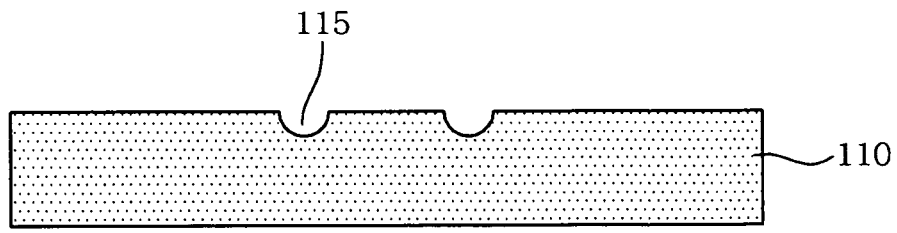

Subsequently, as shown in FIG. 6, the portions of the first carrier 110 which are exposed through the openings 210 for the creation of recesses are etched, and, as shown in FIG. 7, the etching resist 200 is removed, thus creating recesses 115. At this point, in order to create the recesses 115, the portions of the first carrier 110 which are exposed through the openings 210 may be etched through a dry etching process using plasma or a wet etching process using etching solution. In this embodiment, the recesses 115 are created through the wet etching process, and the recesses 115 are formed into a hemispherical shape in the first carrier 110.

Figure 8:
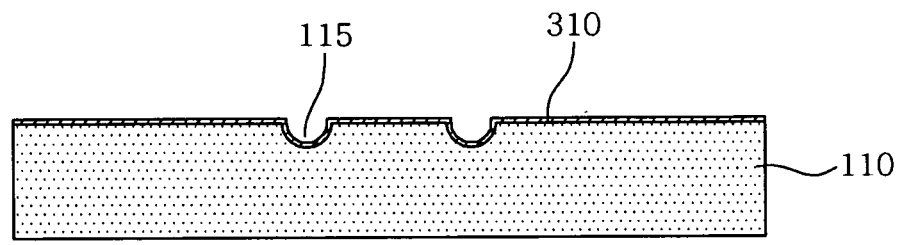

As shown in FIG. 8, a first barrier layer 310 is formed on the first carrier 110 including the recesses 115. The first barrier layer 310, which serves as an etching blocking layer, is made of electroconductive metal which causes the first carrier 110 to be preferentially etched. In this embodiment, the first barrier layer 310 is made of nickel.

Although not shown, a seed layer may be further formed on the first barrier layer 310. The seed layer may be formed by a pretreatment of a subsequent electrolytic plating process, and may be provided in order to ensure efficient progress of the electrolytic plating when the first barrier layer 310 is made of a metal having a low electrical conductivity.

Thereafter, a step of forming an upper circuit layer including metal bumps 615 charged in the recesses 115 and a circuit pattern 610 on the first barrier layer 310 is conducted.

Figure 9:
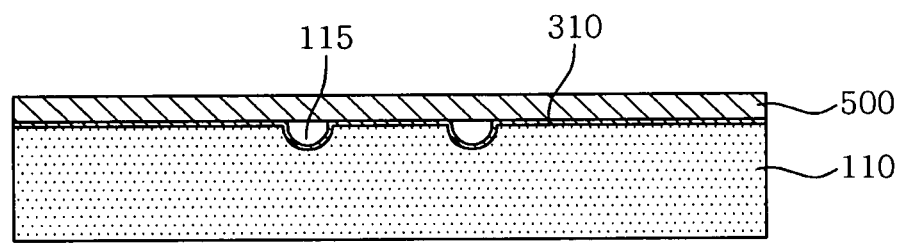

As shown in FIG. 9, plating resist 500 is applied onto the first carrier layer 310. In this regard, the plating resist 500 may be composed of photosensitive film.

Figure 10:
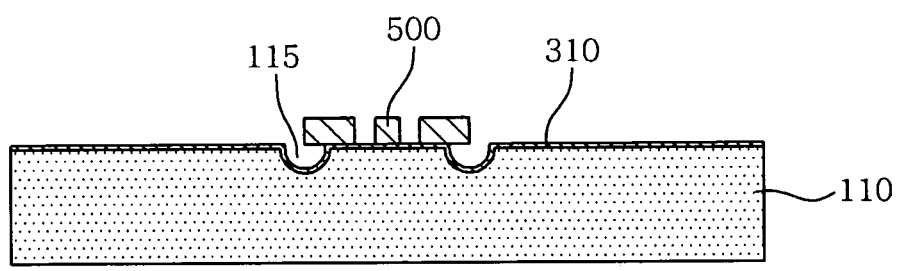

As shown in FIG. 10, the plating resist 500 is subjected to a patterning process such that openings for the creation of a circuit pattern 610 including openings exposing at least a portion of the recesses 115 therethrough are formed. More specifically, the openings for the creation of a circuit pattern 610 including openings exposing at least a portion of the recesses 115 therethrough are formed in a manner such that the plating resist 500 is selectively cured through a mask (not shown) having a light blocking pattern and the uncured portion of the plating resist 500 is removed.

At this time, the plating resist 500 may have openings through which the entire area of the recesses 115 is exposed. However, because errors in the exposure process which is conducted to form the openings for the creation of a circuit pattern 610 connected to the recesses 115 may incur a problem in that the patterned area of the plating resist 500 does not exactly match up with the recesses 115, the plating resist 500 is subjected to the patterning process such that the exposed area ranges only to the center of each of the recesses 115, in consideration of the errors in the exposure process. In this regard, since the recess 115 has a diameter larger than a width of the circuit pattern 610, the patterning of the plating resist 500 over an area ranging to the center of the recess 115 enables the opening, which is subsequently used to form the circuit pattern 610 through which at least a portion of the recess 115 is exposed, to be formed even though there is error in the exposure process.

Figure 11:
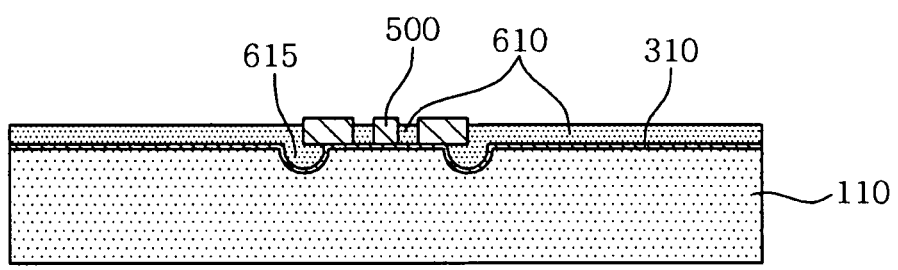

Thereafter, as shown in FIG. 11, the openings of the plating resist 500 are subjected to a plating process, with the result that the upper circuit layer which includes the metal bumps 615 charged in the recesses 115 and the circuit pattern 610 is formed. More specifically, by the plating process which is conducted in the openings of the plating resist 500 using the first barrier layer 310 as a lead-in wire, the upper circuit layer which includes the metal bumps 615 charged in the recesses 115 and the circuit pattern 610 can be formed. The metal bumps 615 and the circuit pattern 610 are made of electroconductive metal which can be preferentially etched with respect to the first barrier layer 301, and are made of copper in this embodiment.

Figure 12:
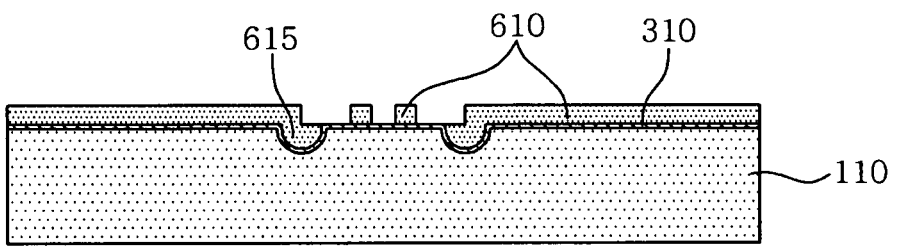

As shown in FIG. 12, the remaining plating resist 500 is removed. The removal of the remaining plating resist 500 enables the upper circuit layer to be formed on the carrier 110.

Figure 13:
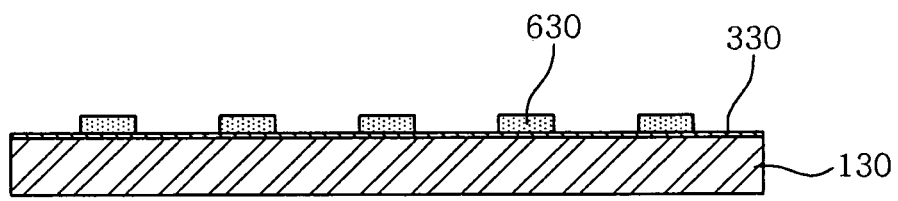

As shown in FIG. 13, a step of forming a second barrier layer 330 on a second carrier 130 and forming a lower circuit layer 630 on the second barrier layer 330 is conducted. The process of forming the lower circuit layer 630 on the second carrier 130 is not greatly different from the process of forming the upper circuit layer on the first carrier 110 except that the second carrier 130 is not provided with the recesses 115. However, when metal bumps are formed on the lower circuit layer 630, the lower circuit layer 630 can be formed through a process substantially identical to the process of forming the first carrier 110.

At this point, the second carrier 130 may be made of a metal similar to the first carrier 110 but is not limited thereto.

The process of forming the lower circuit layer 630 may be conducted concurrently with the process of forming the upper circuit layer. Alternatively, the process may be conducted in a manner such that a single carrier or a pair of carriers which are bonded to each other at facing sides thereof is prepared, and then an upper circuit layer and a lower circuit layer are concurrently formed on both sides thereof, respectively, thus forming the lower circuit layer 630.

The second barrier layer 330 is made of metal which causes the carrier layer 130 to be preferentially etched with respect thereto. In this embodiment, the second barrier layer 330 is made of nickel.

Figure 14:
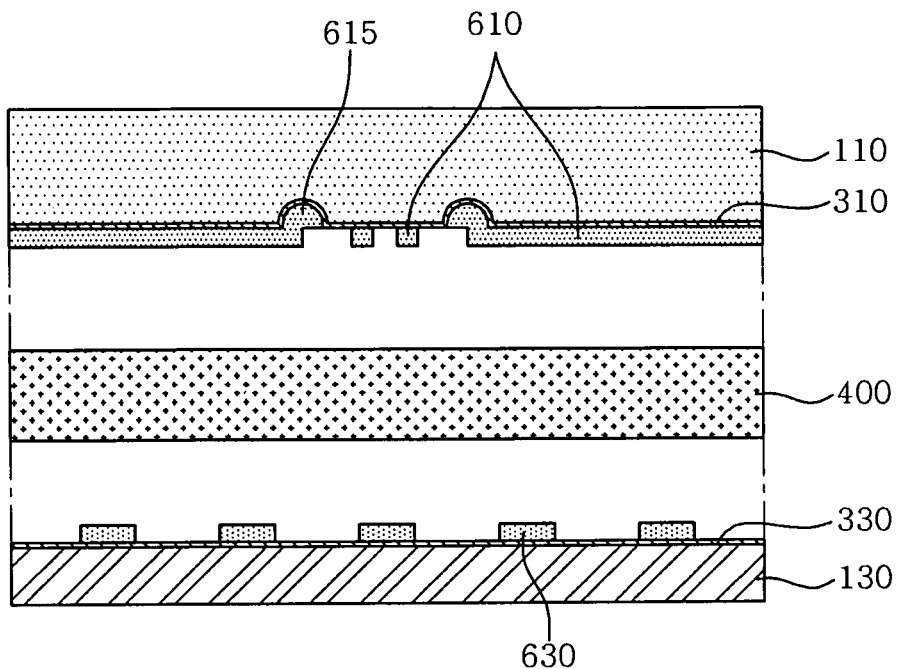
Figure 15:
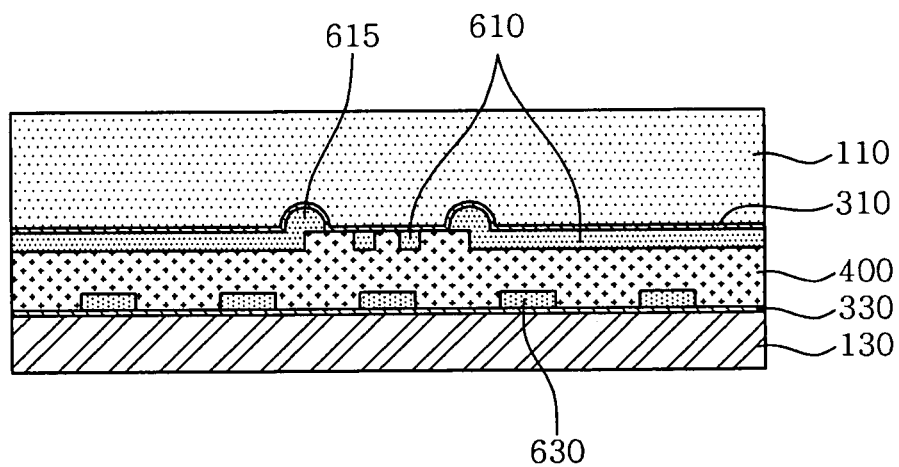

Subsequently, as shown in FIGS. 14 and 15, a step of preparing an insulating layer 400 and then transferring the upper circuit layer and the lower circuit layer 630 to the upper and lower sides of the insulating layer 400 is conducted. Prior to the transfer process, in order to increase adhesive force with the insulating layer 400, the exposed surfaces of the upper circuit layer and the lower circuit layer 630 may be roughened to make the surfaces uneven.

Figure 16:
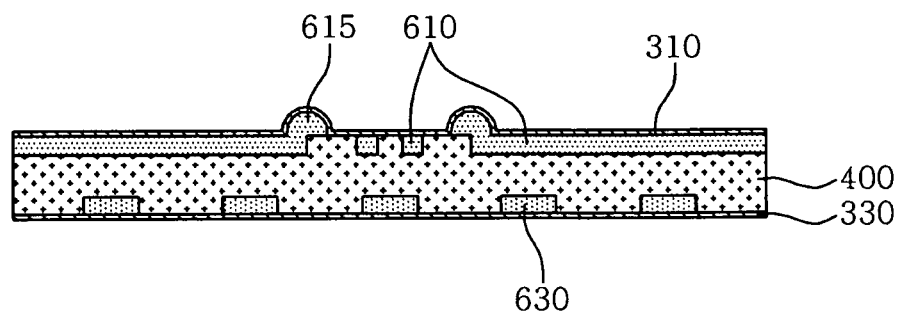

As shown in FIG. 16, the first carrier 110 and the second carrier 130 are removed. The removal of the first carrier 110 and the second carrier 130 is conducted after the completion of curing of the insulating layer 400 and embedding of the circuit layers. Where the first carrier 110 and the second carrier 130 are made of metal, they may be removed using common etching. In this case, because the first carrier 110 and the second carrier 130 are made of metal which is preferentially etched with respect to metal of the first barrier layer 310 and the second barrier layer 330, the first carrier 110 and the second carrier 130 are efficiently removed without damaging the upper circuit layer nor the lower circuit layer 630. Meanwhile, if the second carrier 130 is made of peelable polymer, the second carrier 130 may be removed using the peeling technique.

Although not shown, a process of forming vias for the electrical connection between the upper circuit layer and the lower circuit layer 630 may be conducted. In this case, the insulating layer 400 is perforated to form via holes using a laser drill, and then the via holes are filled with metal through an electroless plating/electrolytic plating processes, thus forming connecting vias for the electrical connection between the upper circuit layer and the lower circuit layer 630.

Figure 17:
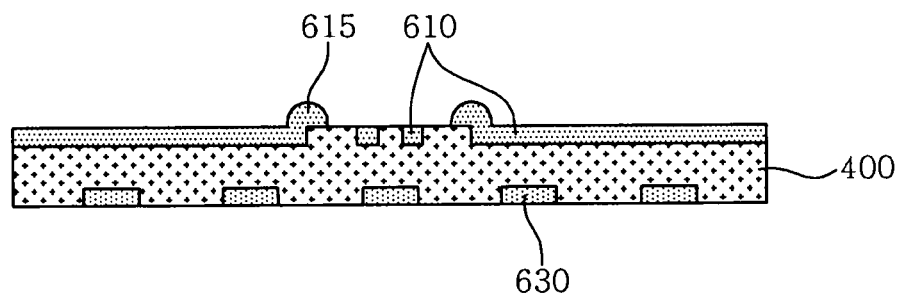

As shown in FIG. 17, a step of removing the first barrier layer 310 and the second barrier layer 330 is conducted. Because the first barrier layer 310 and the second barrier layer 330 are made of a metal which is preferentially etched with respect to a metal of the upper circuit layer and the lower circuit layer 630, the first barrier layer 310 and the second barrier layer 330 are efficiently removed without damaging neither the upper circuit layer nor the lower circuit layer 630. In this embodiment, an etching solution which preferentially acts on nickel is used.

Although not shown, an additional buildup layer which is electrically connected to the lower circuit layer 630 may be formed thereon, or a multilayer board may be manufactured in a simultaneous layering manner. Since the process of manufacturing the multilayer board is well known in the art, a detailed description thereof is omitted herein.

Figure 18:
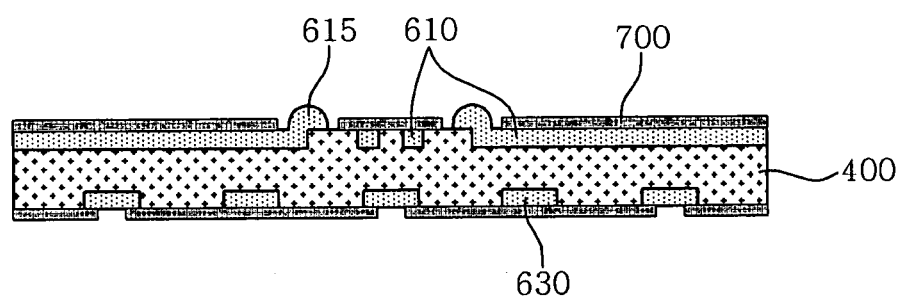

Thereafter, as shown in FIG. 18, solder resist layers 700 are formed on upper and lower sides of the insulating layer 400. The solder resist layers 700 have openings through which the metal bumps 615 and the connecting pads of the lower circuit layer 630 are exposed.

Figure 19:
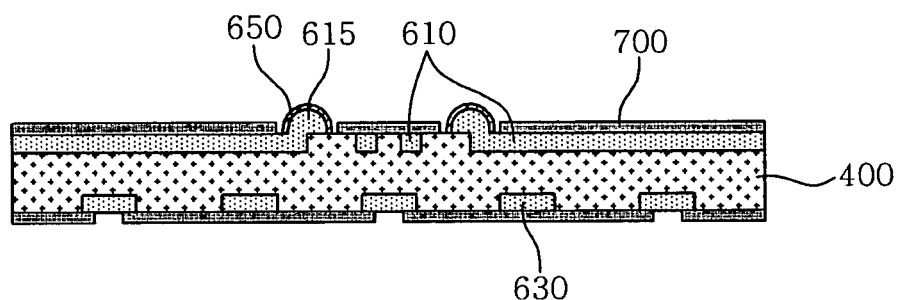

As shown in FIG. 19, surface protection layers 650 are formed on the metal bumps 615. At this time, the surface protection layers 650 may be formed through an OSP treatment or a nickel and gold plating process.

As described above, according to the present invention, since the metal bumps 615 are formed by the process of forming the circuit pattern 610, the metal bumps 615 can be arranged at fine pitches. Furthermore, since pads for the metal bumps 615 are omitted, the outermost circuit layer having a high density can be realized.

In addition, the process according to the present invention is simplified, compared to a process of forming bumps using solder.

Since the printed circuit board according to the present invention includes metal bumps, transmission efficiency of electrical signals is improved. Thanks to an absence of bump pads, the printed circuit board has a high density outermost circuit layer in which pitches of bumps are fine and heights of the bumps are even.

In addition, according to the present invention, the metal bumps are concurrently formed by a process of forming a circuit pattern, thus enabling the metal bumps to have fine pitches.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A method of manufacturing a printed circuit board having a metal bump, comprising:
    forming a recess for creation of the metal bump on a first carrier, forming a first barrier layer on the first carrier, and forming an upper circuit layer on the first barrier layer, the upper circuit layer including a metal bump charged in the recess and a circuit pattern;
    forming a second barrier layer on a second carrier, and forming a lower circuit layer on the second barrier layer;
    preparing an insulating layer, and transferring the upper and lower circuit layers to the insulating layer;
    removing the first and second carriers; and
    removing the first and second barrier layers.

2. The method according to claim 1, further comprising, after removing the first and second barrier layers, forming solder resist layers on both sides of the insulating layer.

3. The method according to claim 1, wherein the first and second carriers and the upper and lower circuit layers are made of electroconductive metal, and the first and second barrier layers are made of a metal that is selectively etched with respect to metals from which the first and second carriers and the upper and lower circuit layers are made.

4. The method according to claim 1, further comprising, after removing the first and second carriers, forming a via for electrical connection between the upper and lower circuit layers.

\* \* \* \* \*